United States Patent [19]
Jung et al.

[11] Patent Number: 5,944,939
[45] Date of Patent: Aug. 31, 1999

[54] WET STATION APPARATUS HAVING QUARTZ HEATER MONITORING SYSTEM AND METHOD OF MONITORING THEREOF

[75] Inventors: Jae-hyung Jung, Suwon; Young-hwan Yun, Youngedeungpo-gu; Se-jong Ko, Suwon; Min-sang Yun, Kunpo, all of Rep. of Korea

[73] Assignee: Samsung Electronics Co., Ltd., Suwon, Rep. of Korea

[21] Appl. No.: 08/735,454

[22] Filed: Oct. 23, 1996

[30] Foreign Application Priority Data

Oct. 24, 1995 [KR] Rep. of Korea ....................... 95-36867

[51] Int. Cl.[6] ........................................................ C23F 1/02
[52] U.S. Cl. ................................ 156/345; 216/84; 216/86
[58] Field of Search ........................... 216/84, 86; 156/345

[56] References Cited

U.S. PATENT DOCUMENTS 4,350,553  9/1982  Mendes ................................... 156/345
5,635,827  6/1997  Judd et al. ............................... 323/321

*Primary Examiner*—Bruce Brenerman
*Assistant Examiner*—Shamim Ahmed
*Attorney, Agent, or Firm*—Jones Volentine, L.L.P.

[57] ABSTRACT

A wet station apparatus used for cleaning and wet etching a semiconductor wafer includes a chemical container for holding a chemical solution, a temperature measuring device for measuring a temperature of the chemical solution, a temperature control unit for comparing the temperature measured by the temperature measuring device with a predetermined reference temperature value, and outputting the result as a control signal, a quartz heater for heating the chemical solution, a power supply controller for receiving the control signal and adjusting the power supplied to the quartz heater, and a power switch connected to the power supply controller, for receiving a heating initiation signal and switching power to the quartz heater, wherein a heater monitoring system is further provided for monitoring the operating states of the quartz heater and the power supply controller and notifying an operator of any problems.

4 Claims, 2 Drawing Sheets

WET STATION APPARATUS HAVING QUARTZ HEATER MONITORING SYSTEM AND METHOD OF MONITORING THEREOF

BACKGROUND OF THE INVENTION

1. Field of the Invention

The present invention relates to a wet station apparatus used for cleaning or etching a semiconductor wafer, and more particularly, to a wet station apparatus having a quartz heater monitoring system and a method of monitoring thereof.

2. Background of the Related Art

In order to clean or wet etch a semiconductor wafer, a chemical solution contained in a chemical bath of the wet station apparatus needs to be preheated to an appropriate temperature. Presently, a heating element is used for heating the chemical bath. However, if the heating element directly contacts the chemical solution, it is likely to be eroded and damaged by the chemical solution. Also, the chemical solution can be contaminated by undesired impurities existing on the surface of the heating element. Accordingly, to prevent these problems, the heating element is put into a sealed quartz tube. This type of heating unit is called a quartz heater.

FIG. 1 is a schematic view illustrating a conventional wet station apparatus. The conventional apparatus, as shown in FIG. 1, includes: a chemical solution 10 which is used for cleaning or wet etching is semiconductor wafer, a chemical container 20 for holding the chemical solution 10, a temperature measuring device 30 for measuring the temperature of the chemical solution 10, a temperature control unit 40 for comparing a temperature measured by the temperature measuring device 30 with a predetermined reference temperature value and outputting the result thereof as a control signal N1, a quartz heater 50 for heating the chemical solution 10, a power supply controller 60 for receiving the control signal N1 and adjusting the power supplied to the quartz heater 50, a power switch 70 connected to the power supply controller 60 for switching power to the quartz heater 50, a Teflon coverlet 80 on which a wafer cassette is placed so as to prevent the quartz heater from directly contacting the wafer cassette during a cleaning or etching process, and a power connector 90 for connecting the quartz heater 50 with the power supply controller 60 and power switch 70.

Here, since the quartz heater 50 is located in the chemical solution 10, a conventional wet station apparatus generates the following problems.

First, if the quartz heater 50 is exposed to the chemical solution 10 for a long time, the quartz tube of the quartz heater 50 reacts with the chemical solution 10. Accordingly, pinholes are apt to form on the surface of the quartz tube or the quartz tube becomes very fragile. Thus, the heating element in the quartz tube 50 is easily eroded by exposure to the chemical solution 10, and the chemical solution 10 is contaminated by undesired impurities from the heating element.

Also, since the Teflon coverlet 80 covers the quartz heater 50, it is difficult to detect the damage of the quartz tube by visual inspection. Furthermore, a conventional wet station apparatus has no way of automatically detecting a damaged quartz tube, which results in severe accidents occurring during the process.

Second, in case where several quartz heaters are provided, even though a heating element of one quartz heater among them is eroded by the chemical solution and then disconnected, the process is continued with the remaining quartz heaters. Accordingly, the preheating time is increased, whereby processing time is also increased.

Third, in case that the power supply controller 60 malfunctions, because the conventional apparatus has no way of promptly detecting the problem, a warning signal is not generated until the quartz heater 50 has overheated.

As described above, because the conventional wet station apparatus, used for the cleaning and wet etching operations related to a semiconductor wafer, has no way of promptly detecting the damage to the quartz tube of the quartz heater nor the disorders of the power supply controller, severe accidents can occur during the process.

SUMMARY OF THE INVENTION

Accordingly, it is an object of the present invention to provide a wet station apparatus having a quartz heater monitoring system for promptly detecting and reporting disorders which are prone to occur in a quartz heater or power supply control means.

To achieve these and other objects, the present invention provides for a wet station apparatus, used for cleaning and wet etching a semiconductor wafer, comprising: a chemical container for holding a chemical solution; temperature measuring means for measuring a temperature of the chemical solution; temperature control means for comparing the temperature measured by the temperature measuring means with a predetermined reference temperature value, and outputting the result as a control signal; a quartz heater for heating the chemical solution; power supply control means for receiving the control signal and adjusting power supplied to the quartz heater; a power switch connected to the power supply control means, for receiving a heating process initiation signal and then switching power to the quartz heater in response thereto; and a quartz heater monitoring system for monitoring operating states of the quartz heater and the power supply control means, respectively, and notifying a user of abnormalities in the respective operating states.

In addition, the quartz heater monitoring system comprises: first comparing means for receiving the control signal output from the temperature control means, and analyzing the control signal to selectively output one of a first signal for increasing the power supplied to the quartz heater and a second signal for decreasing the power supplied to the quartz heater; a current-to-voltage converter installed between the quartz heater and the power switch, for converting a current flowing into the quartz heater to a voltage; second comparing means for comparing a voltage signal input from the current-to-voltage converter with a predetermined reference value, and outputting one of a third signal if the amount of current flowing into the quartz heater is lower than the predetermined reference value and a fourth signal if the amount of current flowing into the quartz heater is higher than the predetermined reference value; state judgment means for receiving the output signals from the first and second comparing means, and analyzing the operating states of the quartz heater and the power supply control means; and indicating means for notifying a user of abnormalities within the operating state of one of the quartz heater and the power supply control means, analyzed by the state judgment means.

Additionally, the state judgement means comprises: a first analyzing unit for outputting one of a fifth, sixth, or seventh signal to said indicating means, wherein the fifth signal, indicating a normal operating state of the quartz heaters and the power supply control means, being outputted if the first comparing means outputs the first signal and the second comparing means outputs the third signal, or the first comparing means outputs the second signal and the second comparing means outputs the fourth signal, and wherein the sixth signal, indicating an abnormal operating state of the quartz heater, being outputted if the first comparing means outputs the first signal and the second comparing means outputs the fourth signal, and wherein the seventh signal, indicating an abnormal operating state of the power supply control means, being outputted if the first comparing means outputs the second signal and the second comparing means output the third signal; and signal interrupting means for interrupting the heating process initiation signal to stop the power supplied to the power switch when one of the sixth and seventh signals is detected.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

A preferred embodiment of the present invention will be described in detail with reference to the attached drawings.

Figure 1:
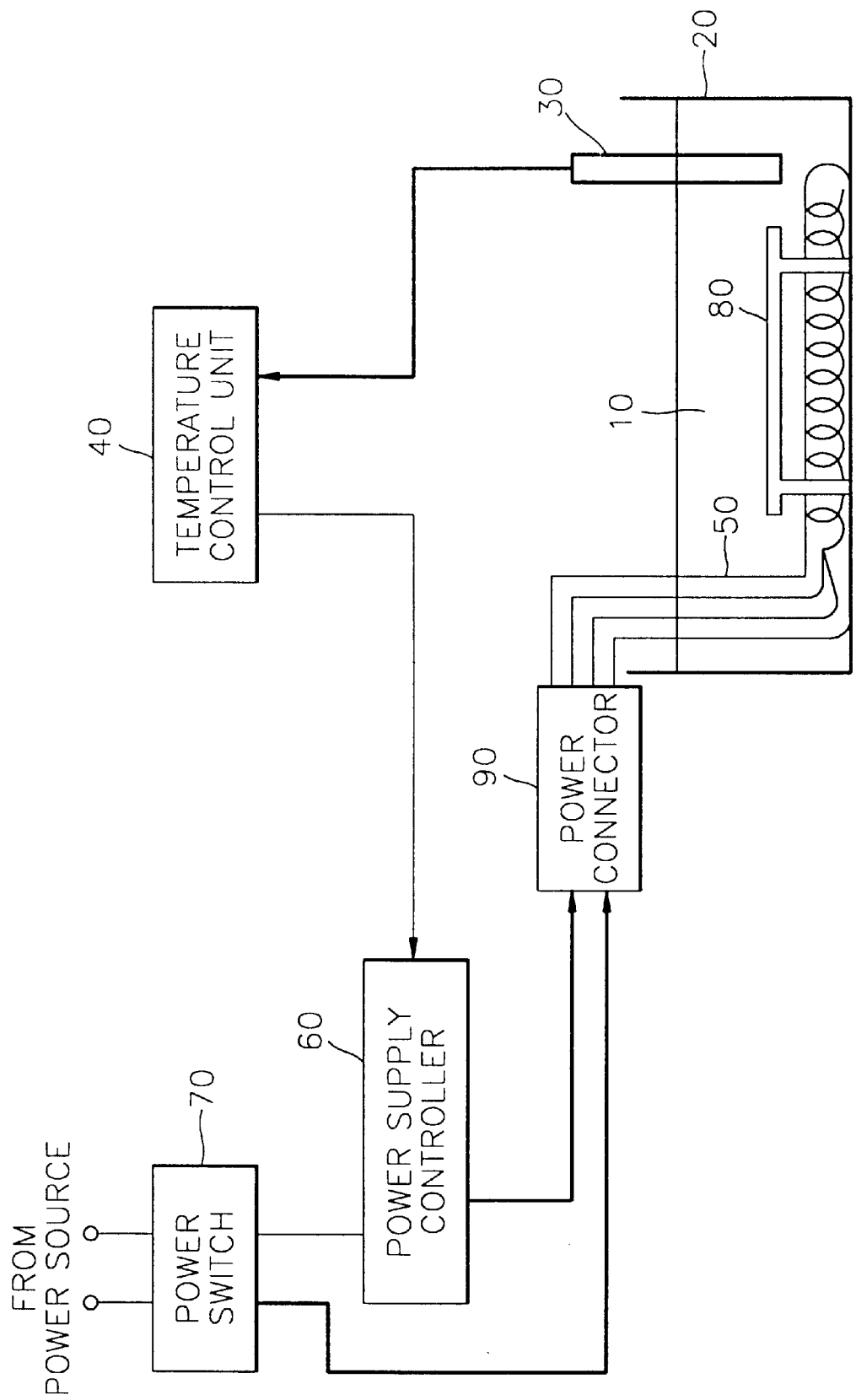
FIG. 1 is a schematic view showing a conventional wet station apparatus.
Figure 2:
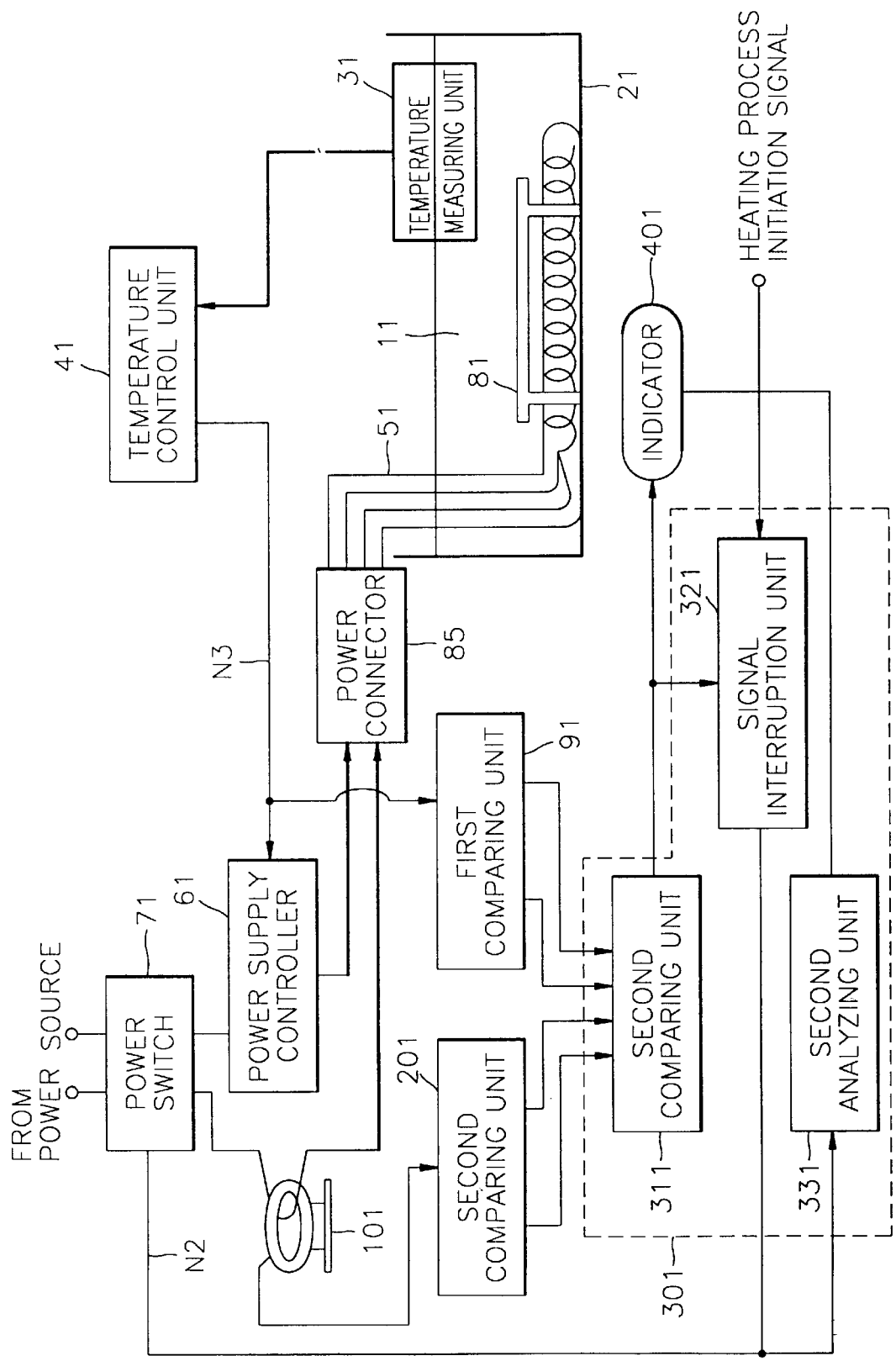
FIG. 2 is a schematic view showing a wet station apparatus having a quartz heater monitoring system according to the present invention.

Referring to FIG. 2, the wet station apparatus according to a preferred embodiment includes: a chemical solution 11 used for cleaning or wet etching a semiconductor wafer, a chemical container 21 for holding the chemical solution 11, and a temperature measuring unit 31, a portion of which is immersed in the chemical solution 11, for measuring the temperature of the chemical solution 11. Quartz heater 51 heats the chemical solution 11. Temperature control unit 41 compares the temperature measured by the temperature measuring unit 31 with a predetermined reference temperature value and outputs the result thereof as a control signal N3. Power supply control unit 61 receives the control signal N3 and adjusts the power supplied to the quartz heater 51. Teflon coverlet 81, immersed in the chemical solution 11, supports a wafer cassette so that it does not directly contact the quartz heater 51. Power connector 85 connects the quartz heater 51 with the power supply control unit 61.

In this embodiment, a power switch 71, connected to the power supply control unit 61, receives a heating process initiation signal N2 and switches power to the quartz heater 51. First comparing unit 91 receives the control signal N3 from the temperature control unit 41 and determines whether to increase or decrease power to the quartz heater 51 based on the control signal N3. A first signal is output for increasing the power, and a second signal is output for decreasing the power to the quartz heater 51. Current-to-voltage converter 101, installed between the quartz heater 51 and the power switch 71, converts the current flowing into the quartz heater 51 to voltages. Second comparing unit 201 compares the voltage signals that are output from the current-to-voltage converter 101 with a predetermined reference value. The second comparing unit then outputs a third signal when the current flowing into the quartz heater 51 is lower than the predetermined reference value or outputs a fourth signal if it is higher. State judgment unit 301 receives the output signals from the first and second comparing units 91 and 20 and then determines the operating state of the quartz heater 51 and the power supply control unit 61. Indicator 401 indicates an abnormal operating state within the quartz heater 51 or the power supply control unit 61.

The state judgment unit 301 will now be discussed in greater detail. The state judgment unit 301 includes a first analyzing unit 311 for analyzing the signals input thereto from the first and second comparing units 91 and 201, respectively. Depending on the analysis, the first analyzing unit 311 outputs a fifth, sixth or seventh signal (described further below) to the indicator 401. Signal interrupting device 321 interrupts the supply of power to the quartz heater 51 if an abnormality occurs in the operating state of either the quartz heater 51 or the power supply control unit 61. In the event that the heating process initiation signal N2 is interrupted, a second analyzing unit 331 determines whether the operating states of either the quartz heater 51 or the power supply control unit 61 are normal, regardless of signals output from the first and second comparing units 91 and 201, respectively, via the signal interruption device 321. The second analyzing unit 331 then transmits the appropriate signal to the indicator 401.

The above-mentioned fifth, sixth and seventh signals, which are outputted from the first analyzing unit 311, are determined as follows. The fifth signal, indicating a normal state of the quartz heater 51 and power supply control unit 61, is output if the first comparing unit 91 outputs the first signal and the second comparing unit 201 outputs the third signal, or the first comparing unit 91 outputs the second signal and the second comparing unit 201 outputs the fourth signal. The sixth signal, indicating an abnormal state of the quartz heater 51, is output if the first comparing unit 91 outputs the first signal and the second comparing unit 201 outputs the fourth signal. The seventh signal, indicating an abnormal state of the power supply control unit 61, is output if the first comparing unit 91 outputs the second signal and the second comparing unit 201 outputs the third signal.

The indicator 401 can either use an alarm for aurally warning a user or a lamp for visually warning the user. Also, a control signal of 0–5V, 0–10V or 0–24V can be used as the control signal N3 in case that the power supply control unit 61 is a solid state relay unit (SSR unit). Furthermore, the current-to-voltage converter 101 converts the current, flowing into the quartz heater 51, into a voltage within the range of 0–5V, to sense the variation of current flowing into the quartz heater 51.

Referring to the embodiment of the present invention as described above, unlike the conventional wet station apparatus, the wet station apparatus of the present invention further comprises a heater monitoring system for promptly detecting abnormalities with either the quartz heater or the power supply control unit and notifying an operator, thereby increasing the speed of the process, and at the same time, preventing severe accidents from occurring.

It should be understood that the invention is not limited to the illustrated embodiment and that many changes and modifications can be made within the scope of the invention by a person skilled in the art.

What is claimed is:

1. A wet station apparatus, used for cleaning and wet etching a semiconductor wafer, comprising:

a chemical container for holding a chemical solution;

a temperature measuring means for measuring a temperature of said chemical solution;

temperature control means for comparing the temperature measured by said temperature measuring means with a reference temperature value, and outputting the result as a temperature control signal;

a quartz heater for heating said chemical solution;

a power supply control means for receiving said control signal and adjusting power supplied to said quartz heater by supplying the quartz heater with a heater control signal;

a power switch connected to said power supply control means, for receiving a heating process initiation signal and then switching power to said quartz heater in response thereto; and a quartz heater monitoring system for monitoring operating states of said quartz heater and said power supply control means, respectively, and notifying a user of abnormalities in said respective operating states, the quartz heater monitoring system comprising a first comparing unit for generating one of a first power control signal to increase the power supplied to the quartz heater and a second power control signal to decrease the power supplied to the quartz heater, based on the temperature control signal;

a second comparing unit for comparing the heater control signal with a reference value and generating a first power status signal if the heater control signal is greater than the reference value and a second power status signal when the heater control signal is less than the reference value; and a state judgment unit for receiving the first and second power control signals and the first and second power status signals, determining the operating states of the quartz heater and the power supply control unit, and if an abnormality occurs in either operating state, notifying the user of the abnormality and interrupting the power supply to the quartz heater.

2. A wet station apparatus, used for cleaning and wet etching a semiconductor wafer, comprising:

a chemical container for holding a chemical solution;

a temperature measuring means for measuring a temperature of said chemical solution;

temperature control means for comparing the temperature measured by said temperature measuring means with a reference temperature value, and outputting the result as a control signal;

a quartz heater for heating said chemical solution;

a power supply control means for receiving said control signal and adjusting power supplied to said quartz heater;

a power switch connected to said power supply control means, for receiving a heating process initiation signal and then switching power to said quartz heater in response thereto; and a quartz heater monitoring system for monitoring operating states of said quartz heater and said power supply control means, respectively, and notifying a user of abnormalities in said respective operating states, wherein said quartz heater monitoring system comprises:

first comparing means for receiving the control signal output from said temperature control means, and analyzing the control signal to selectively output one of a first signal for increasing the power supplied to said quartz heater and a second signal for decreasing the power supplied to said quartz heater;

a current-to-voltage converter installed between said quartz heater and said power switch, for converting a current flowing into said quartz heater to a voltage;

second comparing means for comparing a voltage signal input from said current-to-voltage converter with a predetermined reference value, and outputting one of a third signal if the amount of current flowing into said quartz heater is lower than said predetermined reference value and a fourth signal if the amount of current flowing into said quartz heater is higher than said predetermined reference value;

state judgment means for receiving the output signals from said first and second comparing means, and analyzing the operating states of said quartz heater and said power supply control means; and indicating means for notifying a user of abnormalities within the operating state of one of said quartz heater and said power supply control means, analyzed by said state judgment means.

3. A wet station apparatus as claimed in claim 2, wherein said state judgement means comprises:

a first analyzing unit for outputting one of a fifth, sixth, or seventh signal to said indicating means, wherein said fifth signal, indicating a normal operating state of said quartz heater and said power supply control means, being outputted if said first comparing means outputs the first signal and said second comparing means outputs the third signal, or said first comparing means outputs the second signal and said second comparing means outputs the fourth signal, and wherein said sixth signal, indicating an abnormal operating state of said quartz heater, being outputted if said first comparing means outputs the first signal and said second comparing means outputs the fourth signal, and wherein said seventh signal, indicating an abnormal operating state of said power supply control means, being outputted if said first comparing means outputs the second signal and second comparing means output the third signal; and signal interrupting means for interrupting the heating process initiation signal to stop the power supplied to the power switch when one of said sixth and seventh signals is detected.

4. A wet station apparatus as claimed in claim 3, further comprising a second analyzing unit connected to said signal interrupting means, for conducting a second analysis for determining that the operating states of said quartz heater and said power supply control means are normal, regardless of the sixth and seventh signals output from said signal interrupting means in case that said heating process initiation signal is interrupted, and then providing a result to said indicating means.

* * * * *